United States Patent
Ishii et al.

(10) Patent No.: US 6,622,650 B2
(45) Date of Patent: Sep. 23, 2003

(54) PLASMA PROCESSING APPARATUS

(75) Inventors: Nobuo Ishii, Osaka-fu (JP); Yasuyoshi Yasaka, 5-107, Sudome, Kohata, Uji-Shi, Kyoto-Fu (JP)

(73) Assignees: Tokyo Electron Limited, Tokyo-To (JP); Yasuyoshi Yasaka, Kyoto-Fu (JP); Makoto Ando, Kanagaw-ken (JP)

(*) Notice: Subject to any disclaimer, the term of this patent is extended or adjusted under 35 U.S.C. 154(b) by 103 days.

(21) Appl. No.: 09/726,050

(22) Filed: Nov. 30, 2000

(65) Prior Publication Data

US 2001/0036465 A1 Nov. 1, 2001

(30) Foreign Application Priority Data

Dec. 2, 1999 (JP) ............................. 11-343148
Nov. 30, 1999 (JP) ............................. 11-339748

(51) Int. Cl.$^7$ ..................... C23C 16/00; C23C 14/00; H05H 1/00
(52) U.S. Cl. ............. 118/723 MW; 118/723 AN; 156/345.41; 204/298.38
(58) Field of Search ............. 118/723 MW, 118/723 ME, 723 MR, 723 MA, 723 E, 723 AN; 156/345.41, 345.42, 345.47; 204/298.38; 438/726, 706, 711; 427/575, 569, 585

(56) References Cited

U.S. PATENT DOCUMENTS 6,192,828 B1 * 2/2001 Takahashi et al. ....... 118/723 E
6,357,385 B1 * 3/2002 Ohmi et al. ........... 118/723 AN

FOREIGN PATENT DOCUMENTS

| JP | 2-81434 A | * 3/1990 | ........... H01L/21/31 |
| JP | 3-68771 | 3/1991 | |
| JP | 2000-273646 A | * 10/2000 | ......... C23C/16/511 |

* cited by examiner

Primary Examiner—Parviz Hassanzadek
(74) Attorney, Agent, or Firm—Finnegan, Henderson, Farabow, Garrett & Dunner, LLP

(57) ABSTRACT

A plasma processing system may include a vacuum vessel, a substrate table arranged in the vacuum vessel, and a radio-frequency power supply system for generating high-frequency waves. A waveguide may be provided for guiding high-frequency waves into the vacuum vessel, and a dielectric member may be arranged at an end portion of the waveguide. The plasma processing system may also include a conductive film arranged on the dielectric member and facing the substrate table, wherein the conductive film may have a thickness smaller than or approximately equal to a skin thickness of the conductive film.

5 Claims, 17 Drawing Sheets

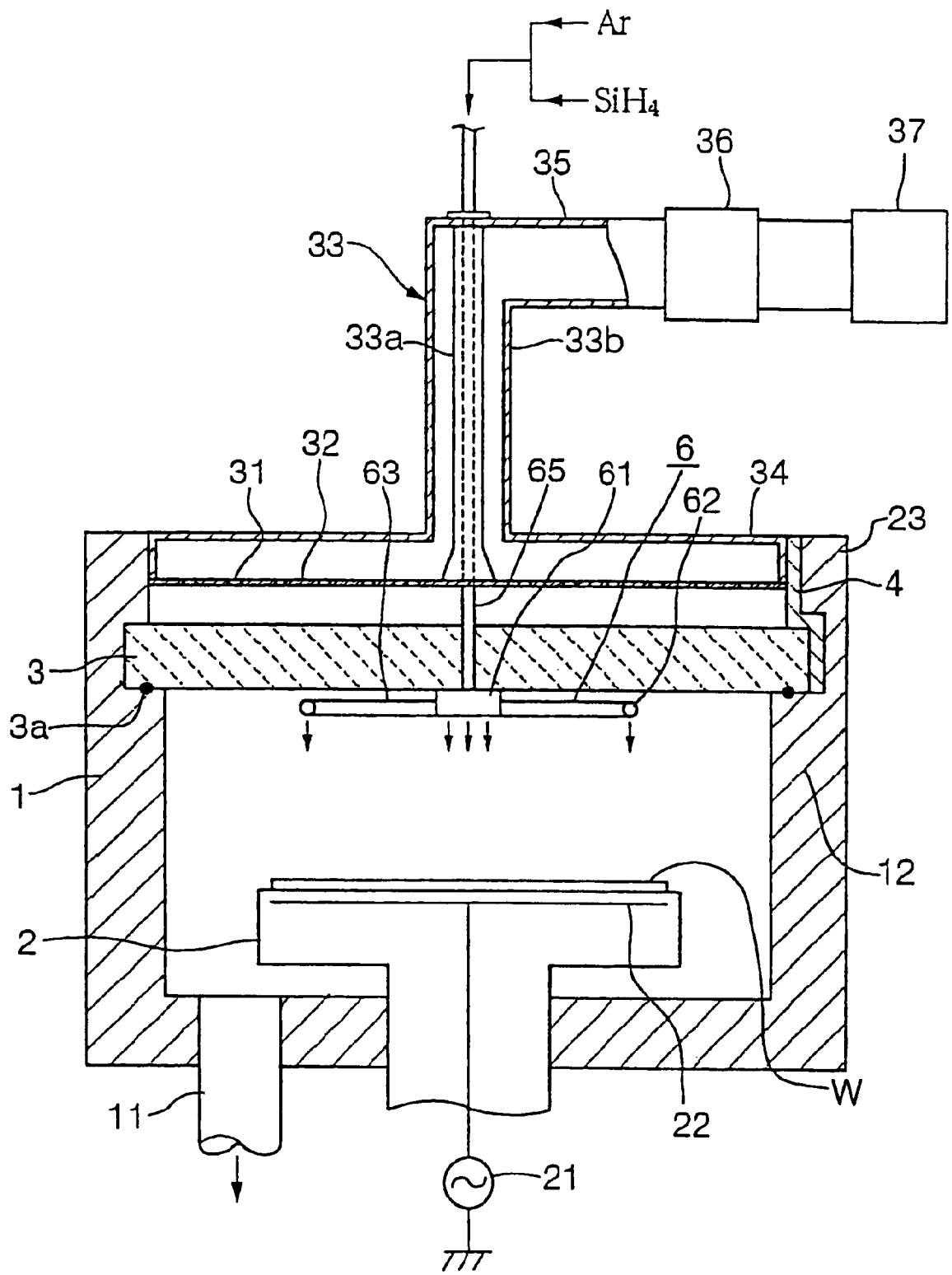
F I G. 13

PLASMA PROCESSING APPARATUS

BACKGROUND OF THE INVENTION

1. Field of the Invention

The present invention relates to a plasma processing system that produces a plasma by the energy of radio-frequency waves, such as microwaves and processes a substrate, such as a semiconductor wafer, by using the plasma.

2. Description of the Related Art

A semiconductor device fabricating method includes a plasma process that processes a semiconductor wafer (hereinafter referred to simply as "wafer") with a plasma. FIG. 22 shows a known microwave plasma processing system capable of carrying out such a plasma process. This known plasma processing system has a vacuum vessel 9 internally provided with a table 90 for a wafer W, a microwave transmitting window 91 of, for example, quartz forming the top wall of the vacuum vessel 9, a slot antenna 92 disposed above the microwave transmitting window 91, and an electromagnetic shielding member 96 of a cylindrical shape disposed above the microwave transmitting window 91 and joined to the upper end of the vacuum vessel 9. A waveguide 94 guides microwaves generated by a microwave power supply system 93 to the antenna 92 to propagate the microwaves in the vacuum vessel 9. A plasma is produced by ionizing a process gas supplied into the vacuum vessel 9 by a gas supply unit 95 by the microwaves. The plasma is used for a film forming process for depositing a film on the surface of the wafer W or for an etching process.

A uniform plasma must be produced in this plasma processing system to process the surface of the wafer W highly uniformly. The field strength distribution of the microwaves is one of the factors that dominate the uniformity of the plasma. It is mentioned in a Japanese patent laid-open publication JP-A No. Hei 3-68771 that the radiant intensity distribution (field strength distribution) of microwaves can be optionally changed by properly designing the construction of the antenna, microwaves are emitted according to the strength of a standing wave produced right in front of the antenna and hence a radiant intensity distribution is uniform when a microwave absorber is disposed immediately in front of the antenna (the exit end of a microwave transmission path) to suppress the standing wave.

The inventors of the present invention varied the mode of microwave radiation by attaching a metallic tape to the antenna 92 and observed the plasma through a CCD camera mounted on the table 90. It was found that brightness distribution in the plasma varies scarcely. It is known from this fact that, even though the field strength distribution of the microwaves can be adjusted by the antenna 92, there exists a factor that disturbs the field strength distribution of the microwaves in a space between the antenna 92 and a plasma luminescent area. The inventors of the present invention acquired a knowledge that a standing wave is produced in a space between the antenna 92 and a cease area, i.e., a nonluminous region between the microwave transmitting window 91 and a luminous plasma region. It is thought that the standing wave is a transverse wave that is generated by the reflection of electromagnetic waves from a side wall when a microwave propagation space is large. Therefore, the uniformity of the field strength distribution of the microwaves is deteriorated by the standing wave and a plasma of irregular density is produced, which makes the highly uniform processing of a surface difficult.

SUMMARY OF THE INVENTION

The present invention has been made under such circumstances and it is therefore an object of the present invention to provide a plasma processing system capable of suppressing the generation of a standing wave in a space between an antenna and a plasma luminescent area, of producing a highly uniform plasma and of achieving highly uniform processing.

The present invention provides a plasma processing system that propagates plasma-producing radio-frequency waves generated by a radio-frequency power supply system through a flat antenna and a radio-frequency wave transmitting window into a vacuum vessel, produces a plasma by ionizing a process gas supplied into the vacuum vessel by the energy of the radio-frequency waves and processes a substrate placed on a substrate table arranged in the vacuum vessel with the plasma, characterized in that the system is configured so that the system is capable of suppressing a standing wave.

The present invention is featured by an electromagnetic wave absorber disposed so as to surround a region between a surface of the radio-frequency wave transmitting window on the side of a vacuum atmosphere in the vacuum vessel and the antenna. Preferably, the electromagnetic wave absorber is divided into a plurality of divisions, the divisions are arranged at circumferential intervals with spaces formed between the adjacent divisions, and the circumferential length of the divisions and the circumferential length of the spaces between the divisions are smaller than $\lambda_g/2$, where $\lambda_g$ is the wavelength of the radio-frequency waves at that part.

It is another features of the present invention that a region between a region between the radio-frequency wave transmitting window and the plasma luminescent area, and a surface of the radio-frequency wave transmitting window on the side of the antenna is divided in a direction perpendicular to the direction of propagation of the radio-frequency waves by conductive members. Preferably, one end part of a length in the range of 5 to 10 mm of each conductive member on the side of the table extends in the plasma luminescent area.

Preferably, the conductive members include a circular or annular first conductive element, and an annular second conductive element surrounding the first conductive element and concentric with the first conductive element. Preferably, the radial distance R2 between the concentric first and the second conductive elements meet an inequality: $\lambda/2 \leq R2 < \lambda$, where $\lambda$ is the wavelength of the radio-frequency waves. Preferably, the inside diameter R1 of the first conductive element meets an inequality: $\lambda/2 \leq R1 < \lambda$. The region may be divided by a plurality of radial conductive elements arranged at angular intervals. A region in which the conductive member is disposed may be defined by only the radio-frequency wave transmitting window. In such a case, the radio-frequency wave transmitting window is divided by the conductive member. The region may be, for example, a region between the radio-frequency wave transmitting window and the plasma luminescent area. In such a case, the conductive member may be used also as a gas supply unit for supplying a process gas to a substrate placed on the table.

BRIEF DESCRIPTION OF THE DRAWINGS

FIG. 13 is a longitudinal sectional view of a plasma processing system in a modification of the plasma processing system shown in FIG. 9, using a gas supply unit as a conductive structure;

DESCRIPTION OF THE PREFERRED EMBODIMENTS

Figure 1:
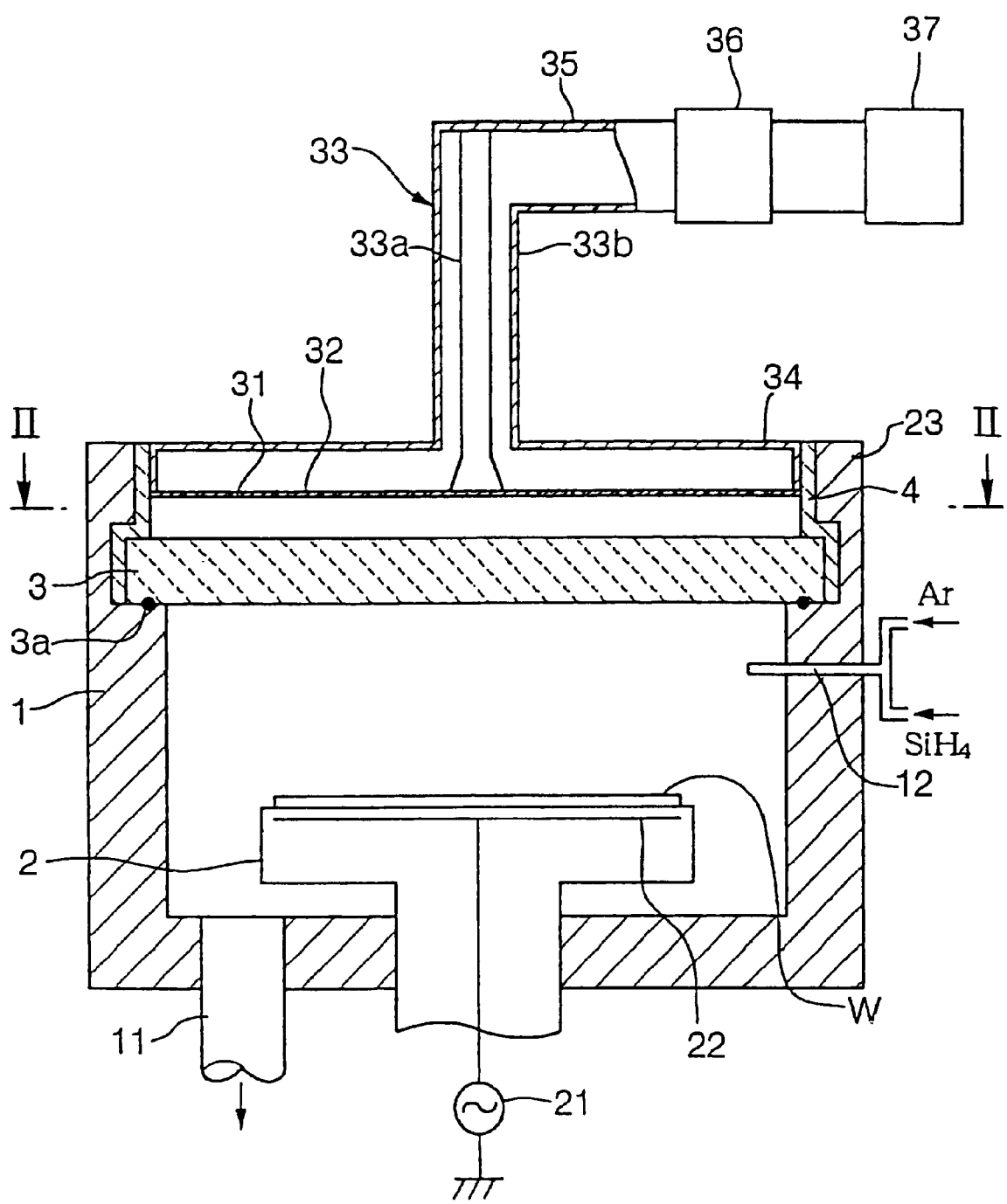
FIG. 1 is a longitudinal sectional view of a plasma processing system in a first embodiment according to the present invention.

FIG. 1 is a sectional view of a plasma processing system in a first embodiment according to the present invention. This plasma processing system has a cylindrical vacuum vessel 1 of aluminum. A table 2 for supporting a wafer W, i.e., a substrate, thereon is placed in the vacuum vessel 1. A discharge pipe 11 for evacuation is connected to the bottom wall of the vacuum vessel 1, and a gas supply unit 12 is attached to the side wall of the vacuum vessel 1. An electrode 22 for applying a bias voltage to the table 2 is embedded in the table 2 and is connected to a radio-frequency power supply system 21 that supplies power of, for example, 13.56 MHz to the table 2. A temperature regulator, not shown, is combined with the table 2 to regulate the temperature of the wafer W at a predetermined temperature. A microwave transmitting window 3 of a dielectric material, such as quartz or a ceramic material ($Al_2O_3$ or AlN) is put on an upper end part of the vacuum vessel 1. The gap between the microwave transmitting window 3 and the vacuum vessel 1 is sealed in an airtight fashion with a sealing member 3a so that a vacuum space can be created under the microwave transmitting window 3. A flat antenna 32 provided with a plurality of slots 31 is disposed over and opposite to the microwave transmitting window 3.

One end of a tube 33a of a coaxial waveguide 33 is connected to a central part of the antenna 32. An outer tube 33b included in the coaxial waveguide 33 has an expanded part 34 of a shape resembling a flat cylinder formed by radially expanding a lower end part of the outer tube 33b in a flange and perpendicularly bending a peripheral part of the flange. One end of a rectangular waveguide 35 is connected to the side of the other end of the coaxial waveguide 33. The other end of the rectangular waveguide 35 is connected through an impedance matching device 36 to a microwave power supply system 37.

The microwave transmitting window 3 is surrounded by a cylindrical part 23 formed continuously with an upper end part of the vacuum vessel 1 and serving as an electromagnetic shield. The upper end surface of the cylindrical part 23 is flush with the upper surface of the expanded part 34. The expanded part 34 is fitted in the cylindrical part 23. The cylindrical part 23 is lined with an electromagnetic wave absorber 4 capable of absorbing microwaves. The electromagnetic wave absorber 4 suppresses the reflection of microwaves to suppress the formation of a standing wave. The electromagnetic wave absorber 4 may be formed of a dielectric material that causes a large dielectric loss, such as a resistor containing carbon, or water, for example, Nikoraito® (Nippon Kosyuha Kabusiki Kaisha), a magnetic material, such as a ferritic ceramic material, or a combination of some of those materials. When using water as the electromagnetic absorber 4, a cylindrical jacket is formed on the inner circumference of the cylindrical part 23 so as to surround a microwave propagation region, an inner wall of the jacket on the side of the microwave propagation region is formed of a glass plate and water is supplied into the jacket.

The operation of the plasma processing system will be described on an assumption that the plasma processing system is applied to forming a polysilicon film on a wafer, i.e., a substrate. A gate valve, not shown, is opened and a wafer W is mounted on the table 2 by a carrying arm, not shown. The gate valve is closed and the vacuum vessel 1 is evacuated to a predetermined vacuum, and then a film forming gas, such as $SiH_4$ gas, and a carrier gas, such as AR gas, are supplied into the vacuum vessel 1 by the gas supply unit 12. Subsequently, the microwave power supply system 37 supplies microwave power of, for example, 2.45 GHz, 2.5 kW and the bias power supply system 21 supplies bias power of, for example, 13.56 MHz, 1.5 kW.

Microwaves emitted by the microwave power supply system 37 propagate through the waveguides 35 and 33 to the expanded part 34. The microwaves travel through the slots 31 of the antenna 32 into the vacuum vessel 1 and ionizes the process gas, i.e., the $SiH_4$ gas, to produce a plasma. Active species produced by ionizing the $SiH_4$ gas deposit on a surface of the wafer W to form a polysilicon film.

Even if the microwaves radiated by the antenna 32 tend to form a standing wave (transverse wave) before the same reach the lower surface, i.e., a surface facing the vacuum space in the vacuum vessel 1, of the microwave transmitting window 3, the microwaves are absorbed by the electromagnetic wave absorber 4 surrounding the microwave propagation space and, consequently, the formation of a standing wave is suppressed.

Since the microwaves travel through the microwave transmitting window 3 into the vacuum vessel 1 with the formation of a standing wave suppressed, the influence of a standing wave on field strength distribution is insignificant. Consequently, a plasma of a uniform plasma density is produced, and the surface of the wafer W is plasma-processed uniformly to form a uniform film on the wafer W.

Although it is desirable to surround entirely a region between the antenna 32 and the lower surface of the microwave transmitting window 3 in view of the objective to suppress the formation of a standing wave in a region through which the microwaves radiated by the antenna 32 to produce a plasma in the vacuum vessel 1, only part of the same region, such as a space between the antenna 32 and the microwave transmitting window 3, or only the microwave transmitting window 3 may be surrounded by the electromagnetic wave absorber 4.

Figure 2:
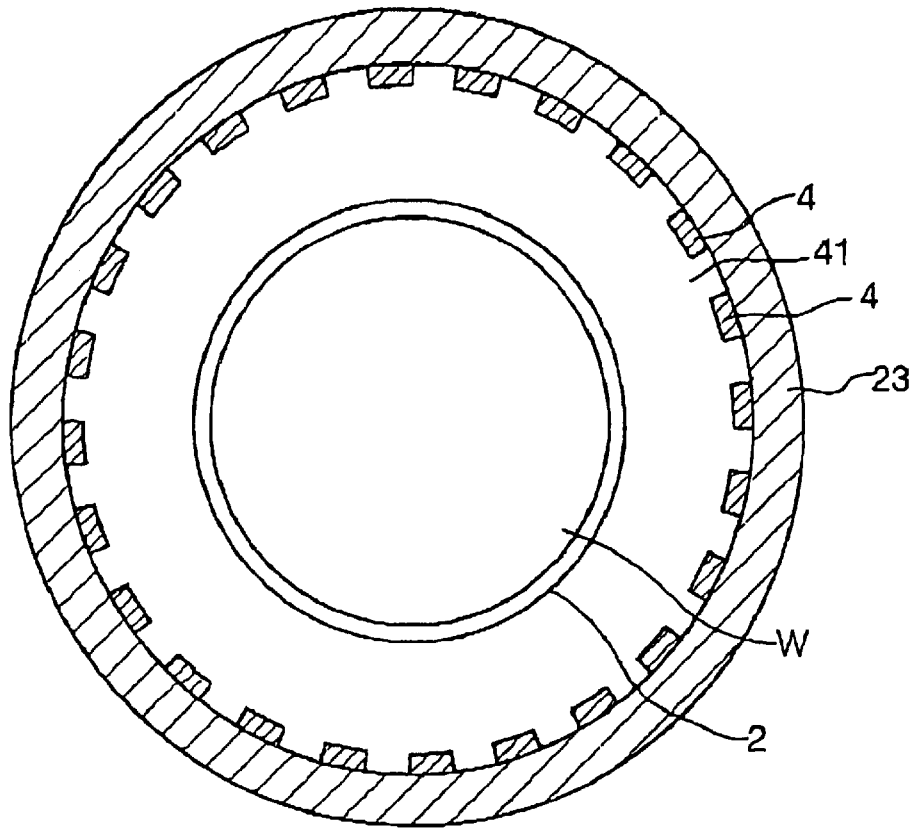
FIG. 2 is a sectional view taken online II—II in FIG. 1, showing an electromagnetic wave absorber included in the plasma processing system shown in FIG. 1, in which only parts necessary for explanation are shown.
Figure 3:
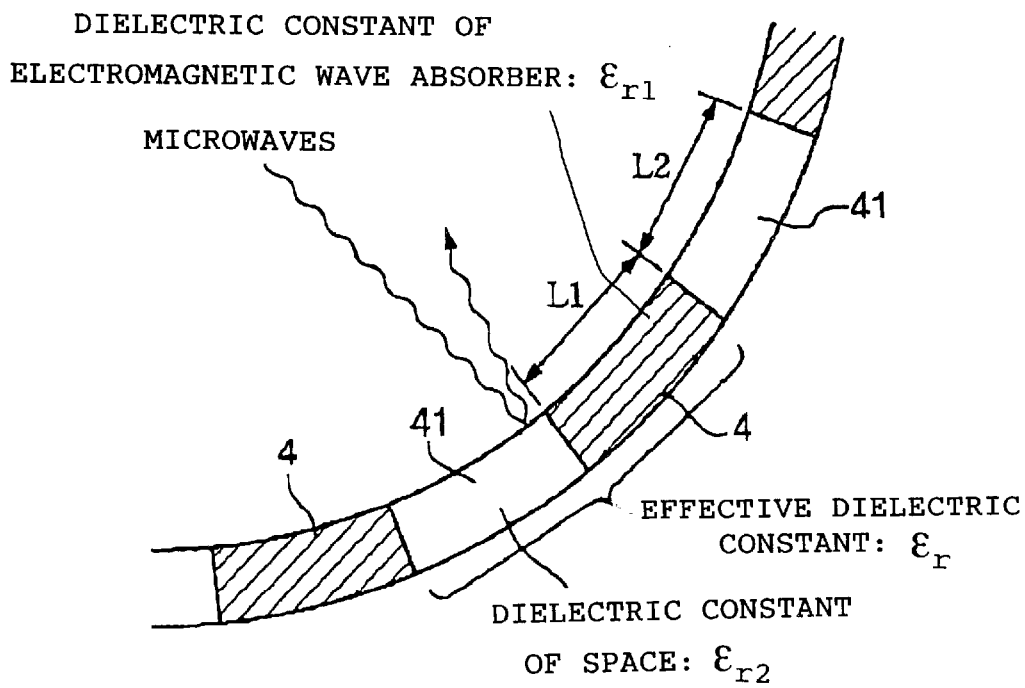
FIG. 3 is an enlarged view showing the disposition of the electromagnetic wave absorber shown in FIG. 2.

Although the electromagnetic wave absorber 4 may be formed so as to surround entirely the region between the antenna 32 and the lower surface of the microwave transmitting window 3, the electromagnetic wave absorber 4 may be divided into a plurality of divisions arranged in a circumferential direction at intervals with spaces 41 formed between the adjacent divisions as shown in FIGS. 2 and 3.

The aims and effects of such an arrangement will be explained. The inventors of the present invention set a probe in a part of the outer tube 33b of the waveguide 33 and measured reflected waves reflected from the antenna 32. It was found that the electromagnetic wave absorber 4 suppresses the reflected waves. It is considered that the electromagnetic wave absorber 4 suppresses the formation of a transverse standing wave (transverse wave) in the region between the antenna 32 and the lower surface of the microwave transmitting window 3.

Although the electromagnetic wave absorber 4 is able to suppress the reflection of microwaves, the impedance of the microwave propagation region changes sharply when microwaves fall on the electromagnetic wave absorber 4. When the electromagnetic wave absorber 4 is formed of aforesaid Nikoraito having a dielectric constant $\in$ of about 9, the ratio of the impedance of the electromagnetic wave absorber 4 to the space is $1/\in^{1/2}$; that is the ratio decreases to 1/3. Thus, it is inferred that part of the microwaves is repelled by a boundary where dielectric constant changes sharply in the medium.

When the electromagnetic wave absorber 4 is divided into the divisions and spaces 41 are formed between the adjacent divisions, respectively, dielectric constant changes gradually for transverse waves.

The adjacent divisions of the electromagnetic wave absorber 4 and the space 41 between the adjacent divisions can be regarded as an arrangement equivalent to a capacitor having a thickness in a vertical direction. Thus, the relative dielectric constant $\in_r$ of the capacitor, i.e., the relative dielectric constant of an electromagnetic wave absorbing part including the adjacent divisions of the electromagnetic wave absorber 4 and the space 41 between the adjacent divisions, is expressed by:

$$\in_r = \in_{r1} \cdot x + \in_{r2} \cdot (1-x)$$

where x is the ratio of the sum of the sectional areas of all the divisions of the electromagnetic wave absorber 4 to the sum of the respective sectional areas of the divisions of the electromagnetic wave absorber 4 and the spaces 41 between the adjacent divisions, which will be called "occupied area ratio", and $\in_{r1}$ and $\in_{r2}$ are the respective relative dielectric constants of the divisions of the electromagnetic wave absorber 4 and the space 41 between the adjacent divisions.

When the electromagnetic wave absorber 4 is formed by arranging the divisions at intervals, the dielectric constant of the electromagnetic wave absorbing part changes gradually, i.e., the impedance changes gradually, for a transverse wave. Consequently, reflected waves are reduced, the microwaves are not disturbed in the space underlying the antenna 32 and, in consequence, transversely highly uniform plasma is produced.

Preferably, both the circumferential length L1 of the division of the electromagnetic wave absorber 4 and the circumferential length L2 of the space 41 are smaller than $\lambda_g/2$, where $\lambda_g$ is the wavelength of the microwaves. If L1 is greater than $\lambda_g/2$, there is a high probability that half the wavelength of the transverse wave falls on the division of the electromagnetic wave absorber 4 and is reflected by the division because impedance changes suddenly at the division. If L2 is greater than $\lambda_g/2$, the full wavelength of a transverse wave passes through the space 41, falls on the side wall of the cylindrical part 23 of aluminum and is reflected and, in consequence, reflected waves increases. Preferably, the circumferential lengths L1 and L2 are greater than $\lambda_g/4$ because manufacturing cost increases if the same are excessively small.

Figure 4:
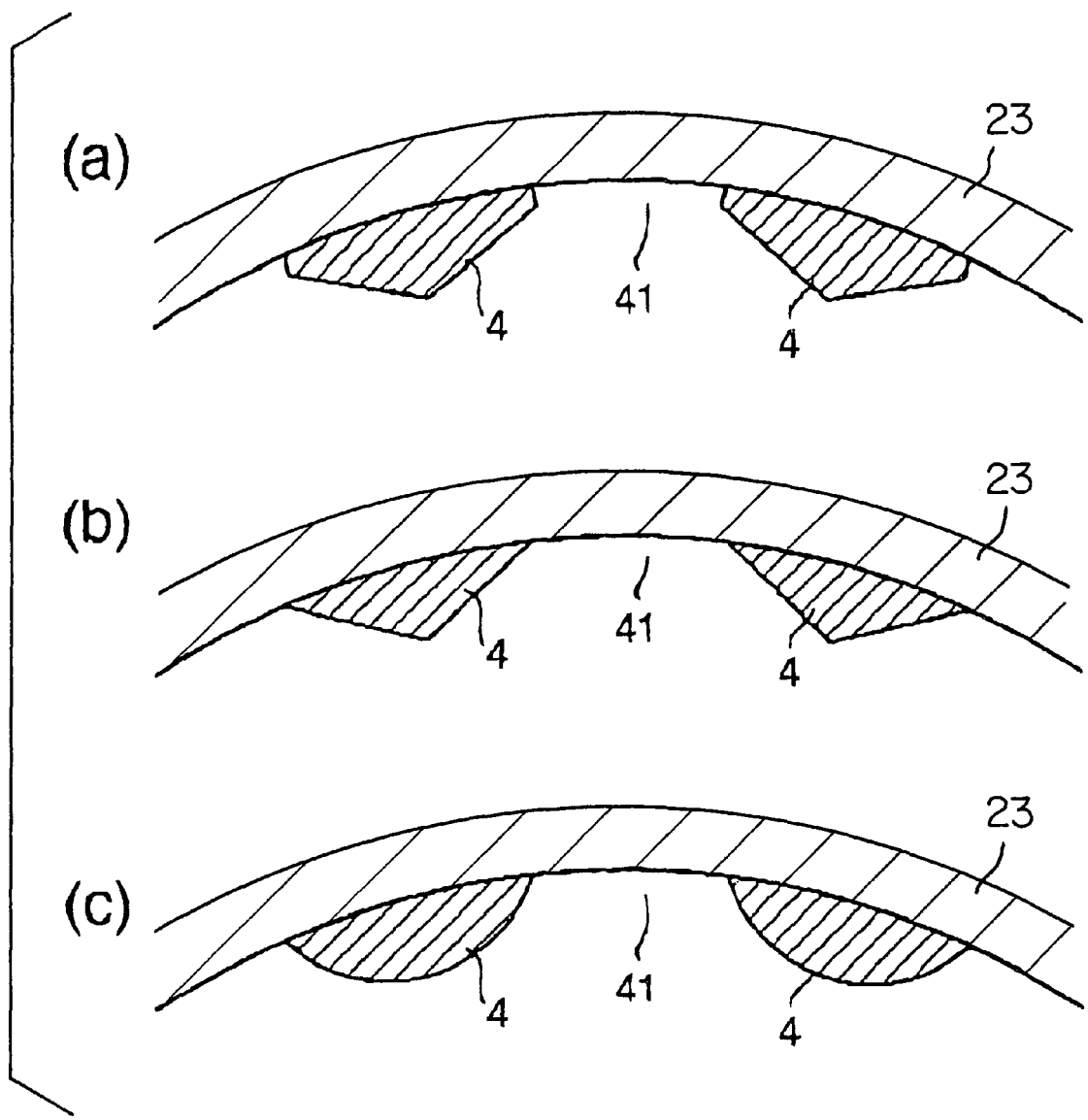
FIG. 4 is a cross-sectional view of modifications of the electromagnetic wave absorber shown in FIG. 2.

The cross-sectional shape of the divisions of the electromagnetic wave absorber 4 is not limited to that shown in FIGS. 2 and 3; the width (circumferential length) of the cross-sectional shape may decrease inward as shown in FIG. 4. The cross-sectional shape may be a pentagonal shape as shown in FIG. 4(a), a triangular shape as shown in FIG. 4(b) or a shape resembling a segment of a circle as shown in FIG. 4(c). Since the dielectric constant of such a division of the electromagnetic wave absorber 4 as shown in FIGS. 4(a), 4(b) or 4(c) changes gradually for a transverse wave, the reflection of the transverse wave can be more effectively suppressed.

Figure 5:
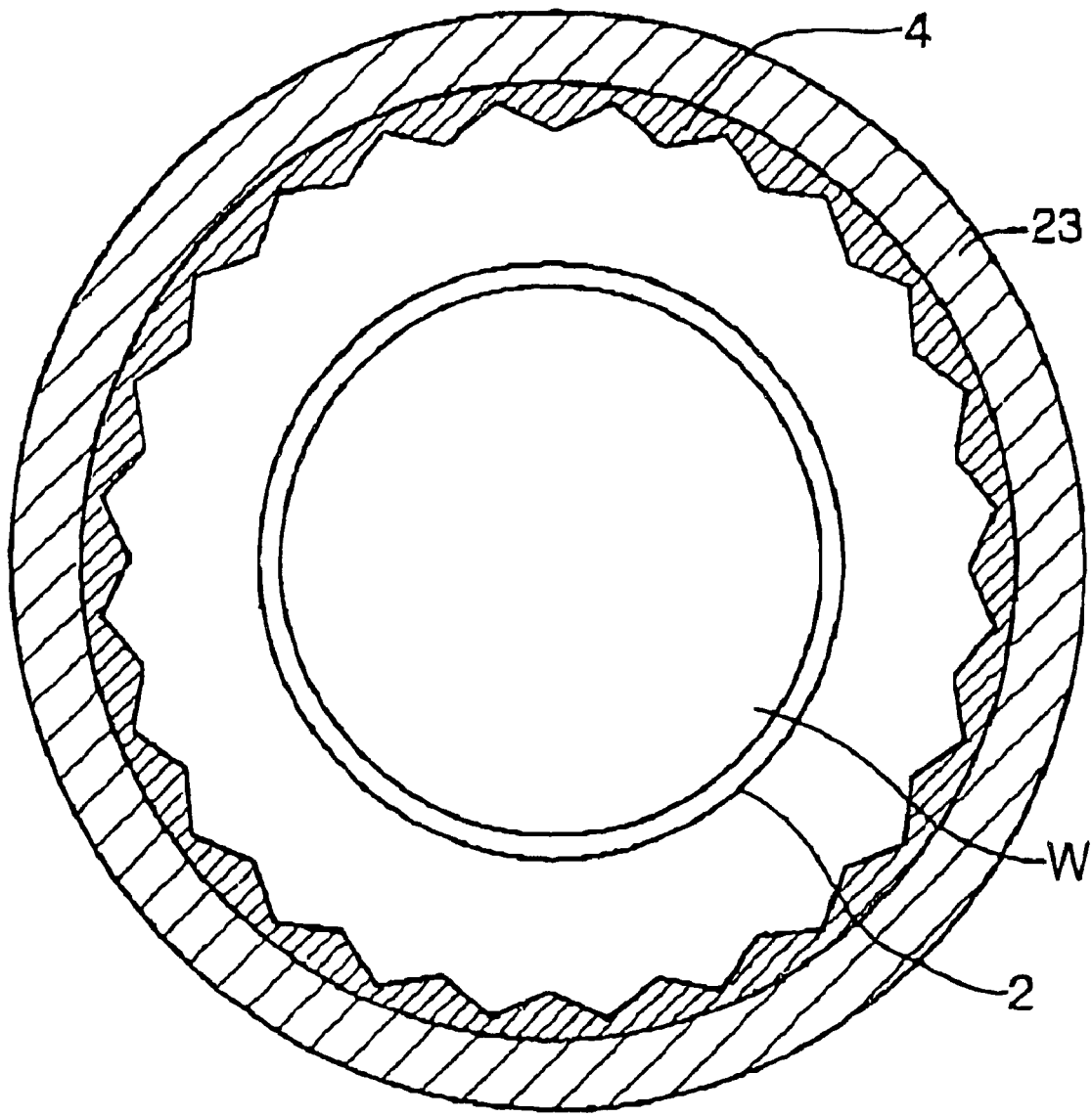
FIG. 5 is a sectional view, similar to FIG. 2, of a modification of the electromagnetic wave absorber shown in FIG. 2.

When the electromagnetic wave absorber 4 has a substantially annular shape, if the electromagnetic absorber 4 has an inner circumference provided with a plurality of projections each having a cross-sectional shape having a width decreasing toward the center of the electromagnetic wave absorber 4 as shown in FIG. 5, the electromagnetic wave absorber 4 is the same in effect as those shown in FIG. 4.

Description will be given of the results of experiments conducted to evaluate the behavior of microwaves when the electromagnetic wave absorber 4 consisting of the plurality of divisions arranged with the spaces 41 formed between the adjacent divisions is employed. Dielectric members of Nikoraito of a shape resembling a rectangular solid having a width (circumferential length) of 2 cm, a longitudinal length of about 4.5 cm and a thickness of 1 cm were arranged at intervals along the circumference of the region between the antenna 31 and the microwave transmitting window 3 of the plasma processing system shown in FIG. 1 to form an electromagnetic wave absorber 4. The experiments used occupied area ratios x of 0% (no electromagnetic wave absorber is provided), 33% (an electromagnetic wave absorber consisting of divisions arranged at circumferential intervals of 4 cm) and 67% (an electromagnetic wave absorber consisting of divisions arranged at circumferential intervals of 1 cm).

Figure 6:
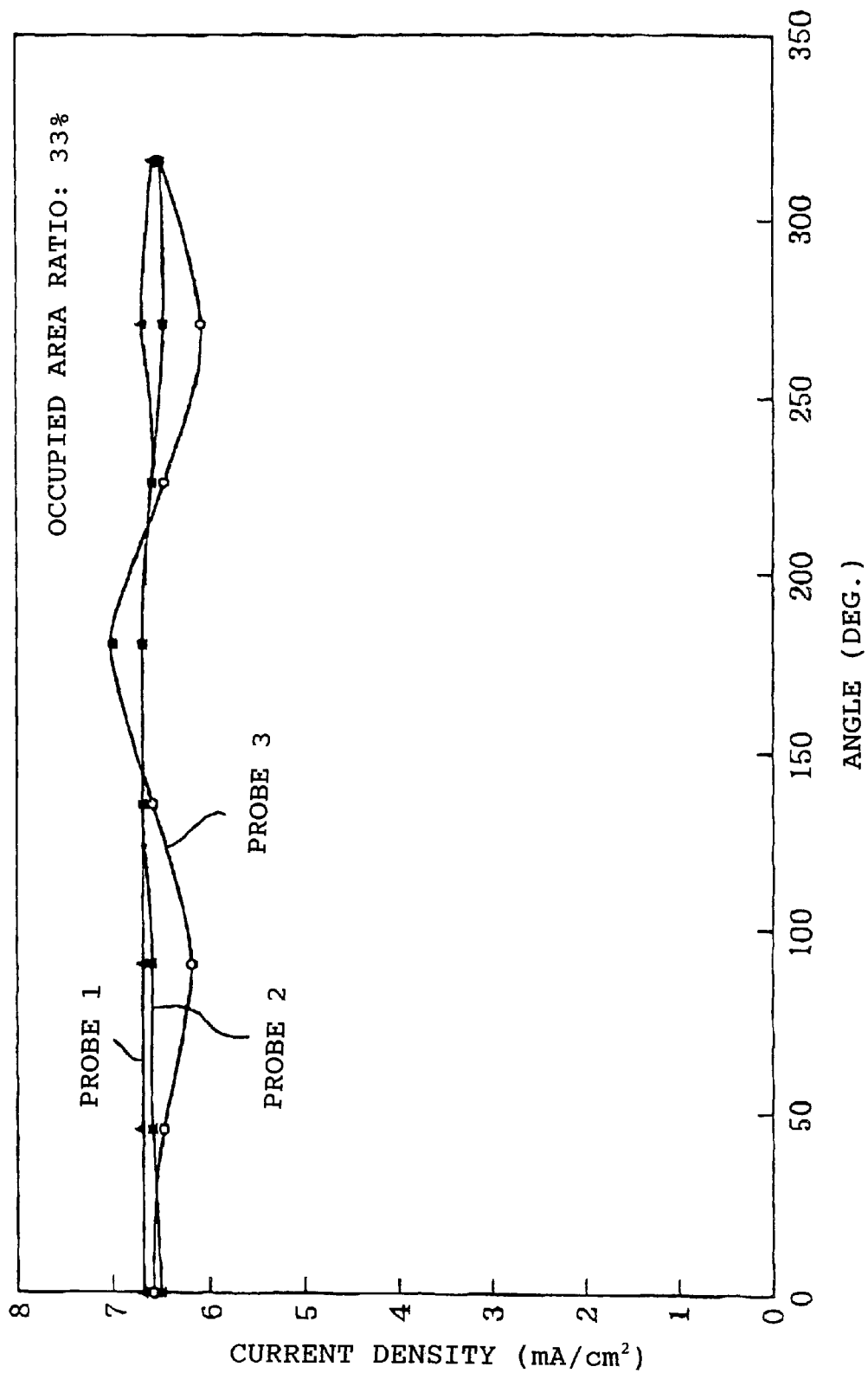
FIGS. 6 to 8 are graphs showing the results of experiments conducted to verify the operation and effect of the embodiments shown in FIGS. 2 and 3.
Figure 7:
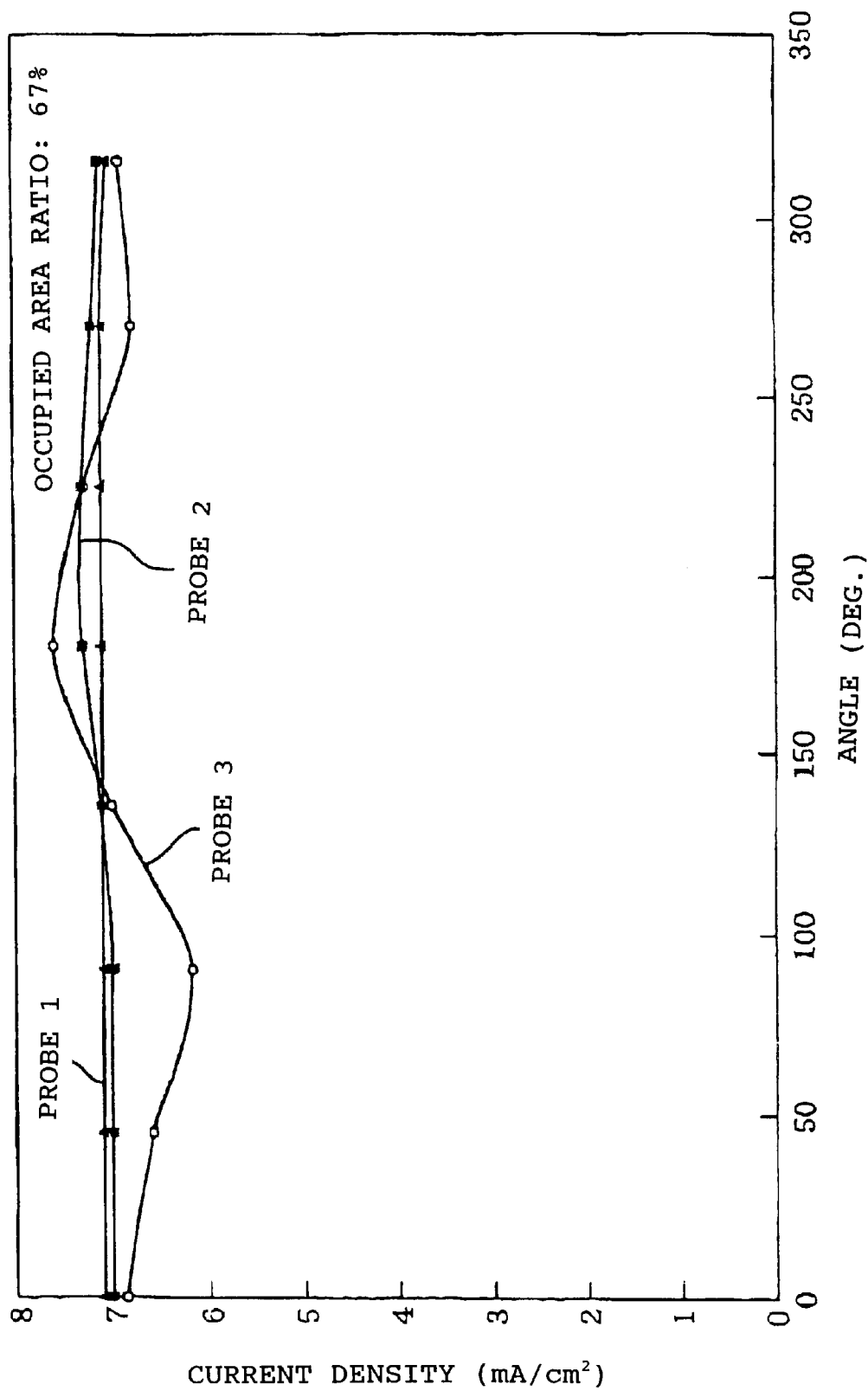
Figure 8:
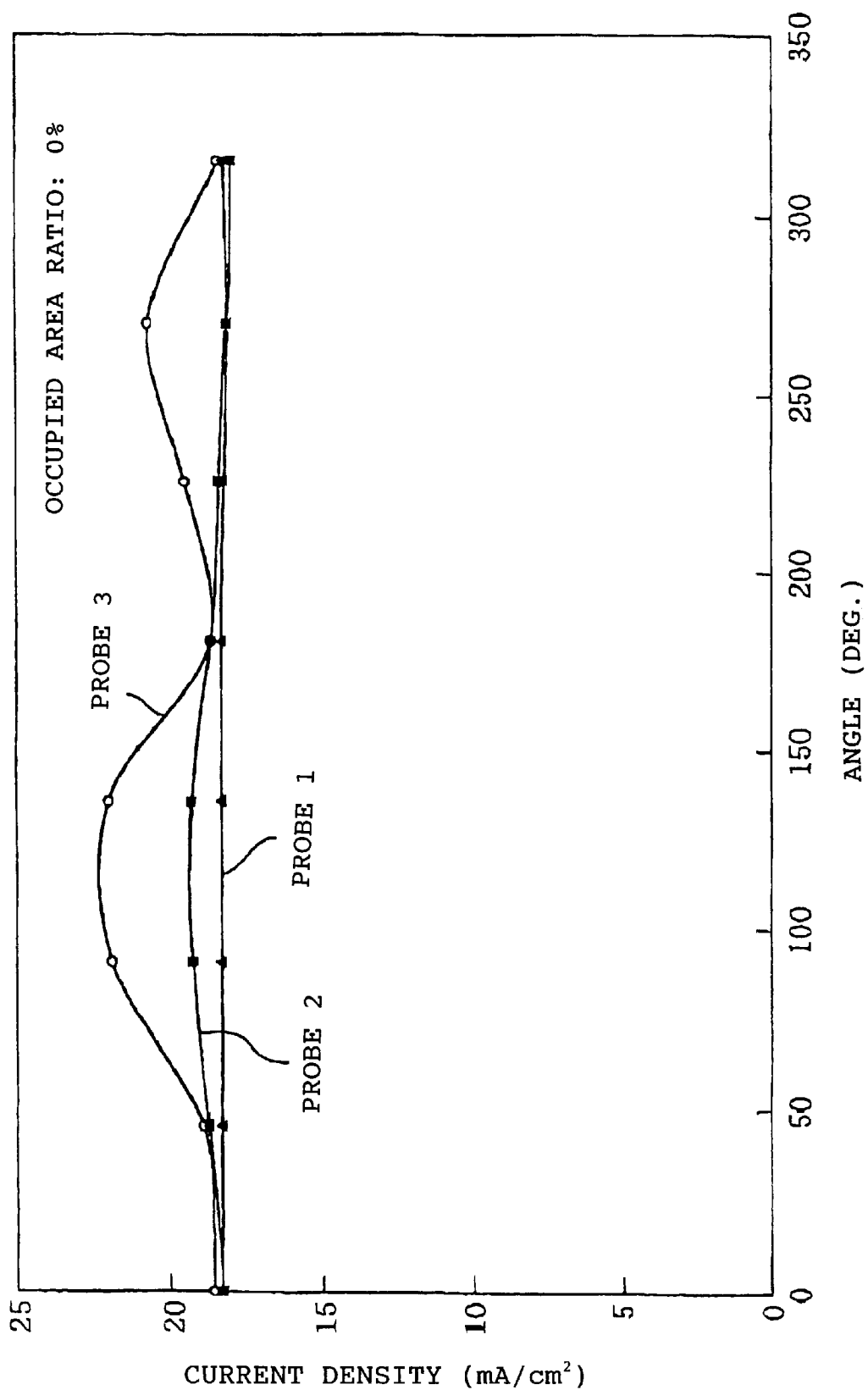

Ion saturation currents were measured with probes for those parameters. Measured results are shown in FIGS. 6 to 8. When measuring the ion saturation current, a probe 1 was set at the center of the cylindrical part 23, a probe 2 was set at a position at a radial distance of 3 cm from the probe 1, and a probe 3 was set at a radial distance of 12 cm from the probe 1, the probes 1 to 3 were directed in the same direction and the direction of the probes 1 to 3 was changed in steps. In graphs shown in FIGS. 6 to 8, differences between currents measured by the probes 1 to 3 represent diametrical current density distributions. As obvious from FIGS. 6 to 8, the current density distribution when the electromagnetic wave absorber having the divisions arranged at intervals is used (when the occupied area ratio x is 33% or 67%) is more uniform than that when any electromagnetic wave absorber was not used (the occupied area ratio x is 0%).

The experiments were conducted under conditions conforming to actual system in which the antenna 31 and the radio-frequency wave transmitting window 3 are disk-shaped and the divisions of the electromagnetic wave absorber 4 are arranged on a circle so as to surround the antenna 31 and the radio-frequency wave transmitting window 3. However, when the substrate is a rectangular LCD substrate and not a circular wafer W, the antenna 31 and the microwave transmitting window 3 are formed in rectangular shapes, respectively, in some cases. In such a case, the divisions of the electromagnetic wave absorber 4 may be arranged in a rectangular arrangement conforming to the rectangular antenna 31 and the rectangular microwave transmitting window 3. Functions and effects of a plasma processing system provided with such a rectangular antenna 31 and a rectangular microwave transmitting window 3 are the same as those of the plasma processing system provided with the circular antenna 31 and the circular microwave transmitting window 3.

Figure 9:
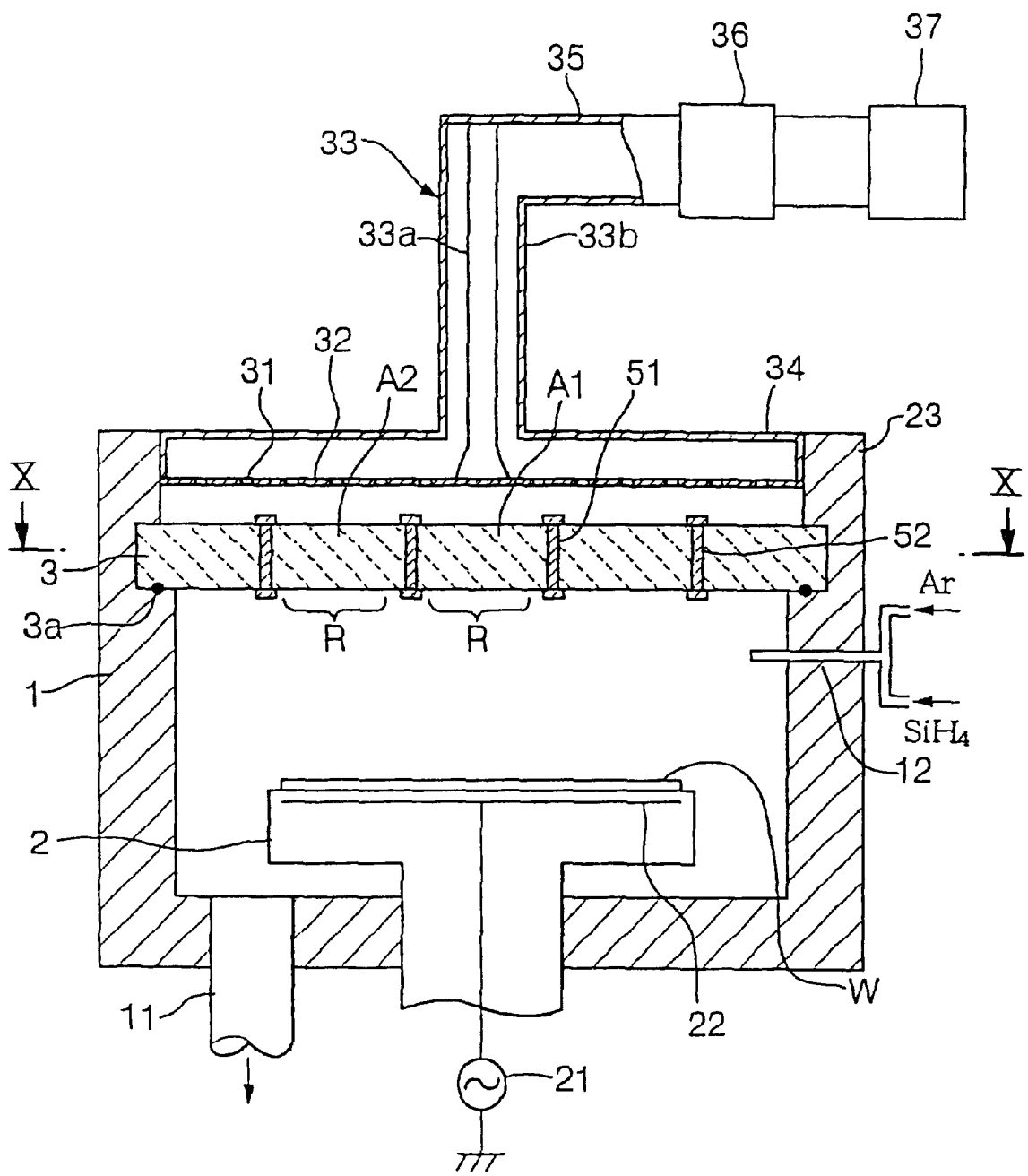
FIG. 9 is a longitudinal sectional view of a plasma processing system in a second embodiment according to the present invention.
Figure 10:
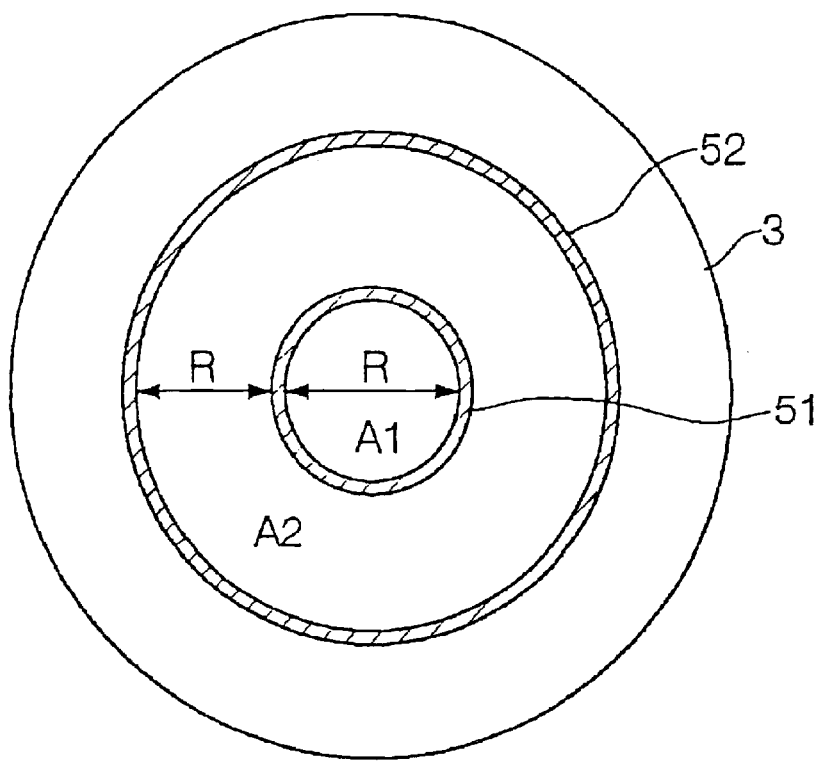
FIG. 10 is a sectional view taken on line X—X in FIG. 9.

FIGS. 9 and 10 show another embodiment of the present invention. In this embodiment, the plasma processing system has a microwave transmitting window 3 provided with a ring-shaped first conductive element 51 of a small diameter and a ring-shaped second conductive element 52 of a large diameter. The first conductive element 51 and the second conductive element 52 are concentric with each other, coaxial with an center axis of a wafer W placed on a table 2 and are embedded in the microwave transmitting window 3. Thus, the first conductive element 51 and the second conductive element 52 divide the microwave transmitting window into a circular central part A1, an annular middle part A2 and an annular peripheral part as shown in FIG. 10. The conductive elements 51 and 52 are embedded in the microwave transmitting window 3 so that upper and lower end parts thereof project outside from the upper and the lower surfaces of the microwave transmitting window 3, respectively. The diameter R of the circular central part A1 and the width R of the annular middle part A2 are equal to half the wavelength $\lambda$ ($\lambda/2$) of microwaves to be used by the plasma processing system.

Longitudinal microwaves are able to pass through the circular central part A1, the annular middle part A2 and the annular peripheral part demarcated by the conductive elements 51 and 52. However, it is difficult for transverse waves to form because the diameter of the circular central part A1 and the width of the annular middle part A2 and the annular peripheral part are equal to $\lambda/2$ and the circular central part A1, the annular middle part A2 and the annular peripheral part are demarcated by the conductive elements 51 and 52; that is, the formation of a standing wave can be suppressed. It is preferable that $\lambda/2 \leq R < \lambda$ to suppress the formation of a standing wave. The wavelength $\lambda$ of microwaves of 2.45 GHz is about 12 cm and the second conductive element 52 is about 18 cm. When processing a 20 cm diameter wafer W, the distance between the outer circumference of the second conductive element 52 and the cylindrical part 23 is in the range of, for example, $\lambda/2$ to $\lambda$. Therefore, it is difficult for a standing wave to form in the annular peripheral part of the microwave transmitting window 3, surrounding the second conductive element 52. Since the distribution of the field strength of the microwaves is highly uniform, the surface of the wafer W can be highly uniformly processed.

Figure 11:
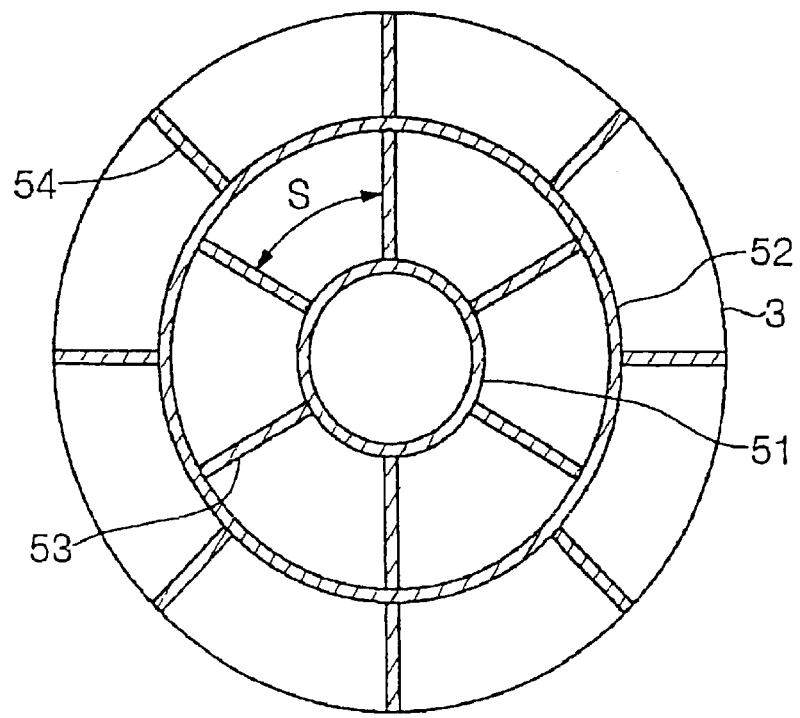
FIG. 11 is a cross sectional view, similar to FIG. 10, of a modification of the conductive structure shown in FIG. 10.

A plurality of conductive plates 53 may be radially extended between the first conductive element 51 and the second conductive element 52 to divide the annular middle part A2 into a plurality of segments as shown in FIG. 11. Moreover, a plurality of conductive plates 54 may be radially extended in the annular peripheral part surrounding the second conductive element 52. Preferably, $\lambda/2 \leq S < \lambda$, where $\lambda$ is the wavelength of the microwaves and S is the length of an arc between the radially middle points of the adjacent conductive plates 53 bounding each segment, of a circle having its center at the center of a circle corresponding to the second conductive element 52, and passing the radially middle points of the conductive plates 53. The conductive plates 53 suppress the formation of a standing wave rising in circumferential directions.

Figure 12:
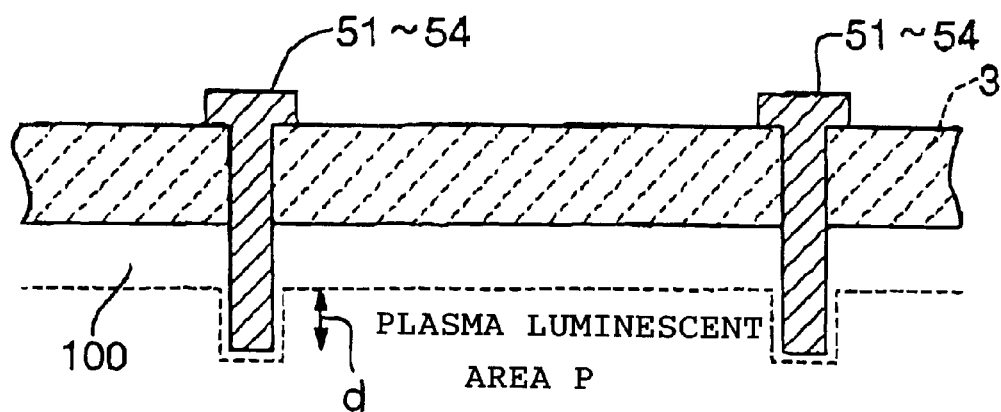
FIG. 12 is a view of assistance in explaining the positional relation between a conductive structure shown in FIG. 9 and a plasma luminescent area.
Figure 12:
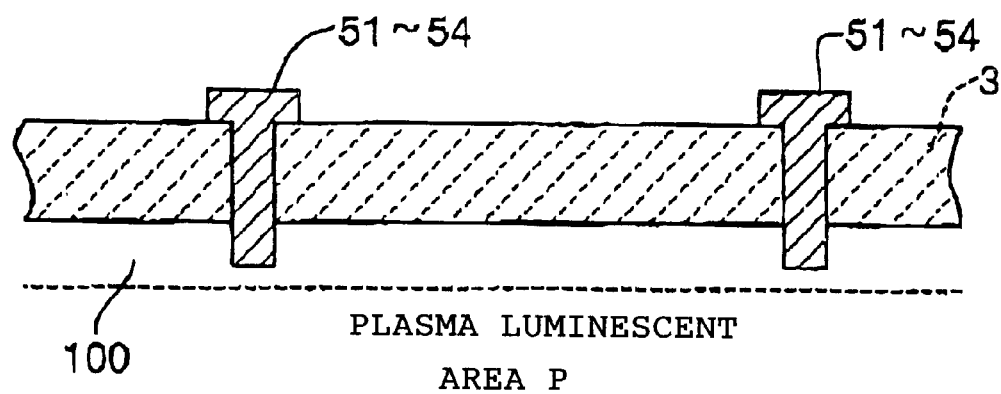

Preferably, lower end parts of the conductive elements 51 and 52 and the conductive plates 53 and 54 are extended into a plasma luminescent area P as shown in FIG. 12(a). The plasma luminescent area P bounded by broken lines in FIG. 12(a) extends under a level at a short distance in the range of, for example, 5 to 10 mm from the lower surface of the microwave transmitting window 3 and a cease area 100 extends between the lower surface of the microwave transmitting window 3 and the plasma luminescent area P. If the lower ends of the conductive elements 51 and 52 and the conductive elements 53 and 54 are substantially on a level corresponding to the upper boundary of the plasma luminescent area P as shown in FIG. 12(b), transverse waves pass through the cease area 100 and, consequently, a standing wave is formed. When the lower end parts of the conductive elements 51 and 52 and the conductive elements 53 and 54 are extended into the plasma luminescent area P as shown in FIG. 12(a), recesses are formed in the upper boundary of the plasma luminescent area P and hence transverse waves are unable to pass easily through the cease area, i.e., unable to propagate efficiently, and, consequently, a standing wave cannot easily rise. Preferably, the length of the lower end parts of the conductive elements 51 and 52 and the conductive elements 53 and 54 extended into the plasma luminescent area P is in the range of about 5 to about 10 mm.

Figure 14:
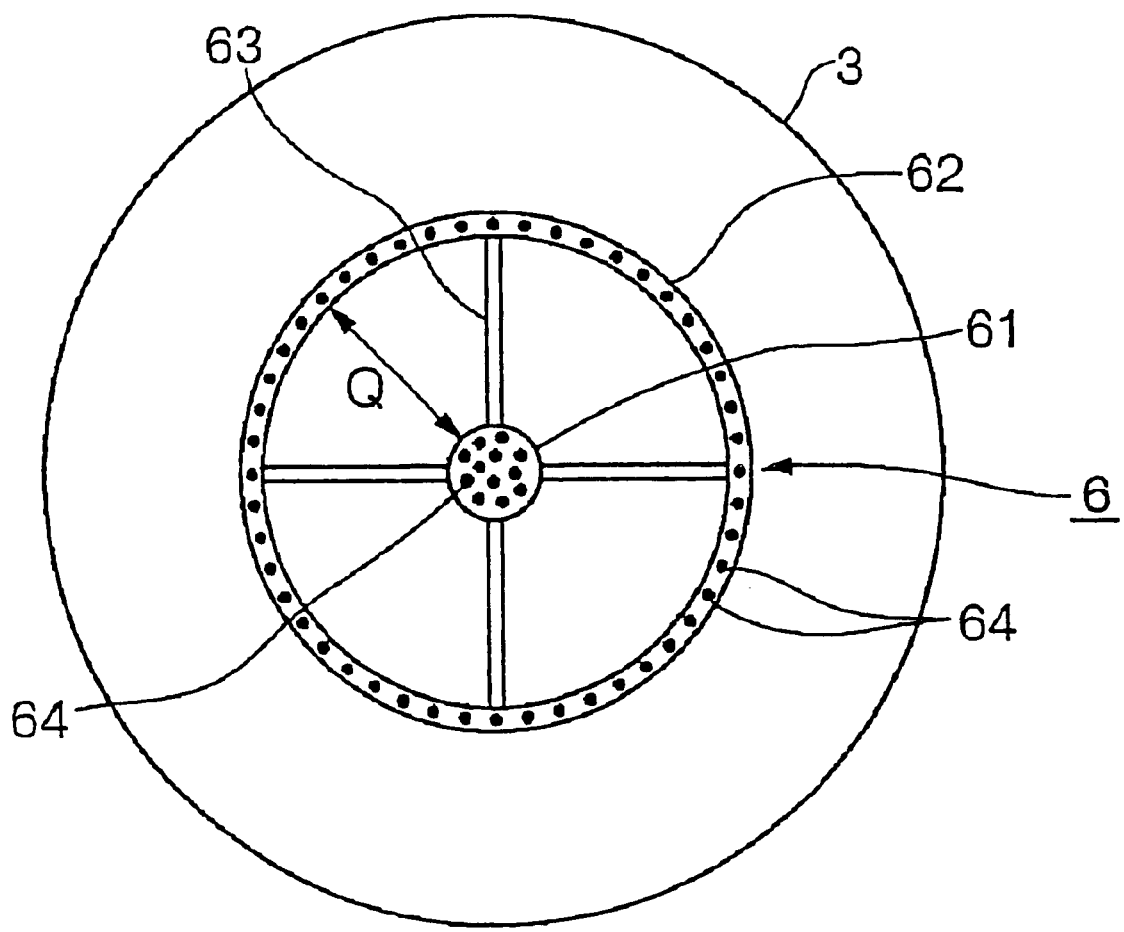
FIG. 14 is a bottom view of the gas supply unit shown in FIG. 13 taken in the direction of the arrow XIV in FIG. 13.

FIGS. 13 and 14 show another embodiment of the present invention. In this embodiment, a plasma processing system is provided with a gas supply device 6 formed of a conductive material, such as aluminum, and disposed in a cease area between the lower surface of a microwave transmitting window 3 facing a vacuum atmosphere and a plasma luminescent area. The gas supply device 6 has a circular member 61 corresponding to the first conductive element and coaxial with a center axis of a wafer W places on a table 2, i.e., coaxial with a center axis of a vacuum vessel 1, an annular member 62 corresponding to the second conductive element and concentric with and surrounding the circular member 61, and four support pipes 63 radially extending between the circular member 61 and the annular member 62.

Gas passages are formed in the circular member 61 and the annular member 62. The gas passages of the circular member 61 and the annular member 62 are communicated with each other via an inner spaces of the support pipes 63. A plurality of gas jetting holes 64 are formed in the lower walls of the circular member 61 and the annular member 62. A process gas supplied through the gas passages are discharged through the gas jetting holes 64 into the vacuum vessel 1. A gas supply pipe 65 of a conductive material is connected perpendicularly to the upper wall f the circular member 61. The gas supply pipe 65 is extended through the microwave transmitting window 3, an antenna 32 and a tube 33a of a coaxial waveguide 33, penetrates a waveguide 35 and is connected to gas sources, not shown.

The circular member 61 may be extended through the microwave transmitting window 3 or may be attached to the lower surface of the antenna 32. A ring-shaped member may be used instead of the circular member 61. It is preferable that the diameter of the circular member 62 or the inside diameter of the ring employed in stead of the circular member 61 meet an inequality: $\lambda/2 \leq$ Diameter (Inside diameter)$<\lambda$. The gas supply pipe 65 and the tube 33a form a coaxial waveguide for microwaves. Since microwaves propagate through this waveguide, it is preferable to surround the gas supply pipe 65 by a shielding member of a diameter greater than the inside diameter of the tube 33a.

When a plasma is produced, a cease area is formed in a space of, for example, about 1 cm in thickness is formed under the lower surface of the microwave transmitting window 3. The gas supply device 6 is formed in a size that permits the gas supply device 6 to be included in the cease area. The circular member 61 and the annular member 62 of the gas supply device 6 divides a microwave propagation region to suppress the formation of a standing wave. Therefore, the circular member 61 and the annular member 62 are formed such that the radial distance Q between the circular member 61 and the annular member 62 meets an inequality: $\lambda/2 \leq Q < \lambda$.

Plasma density distribution (active particle density distribution) in a plane parallel to the wafer W is strongly dependent on the field strength distribution of microwaves right in front of the plasma luminescent area. Therefore, the suppression of the formation of a standing wave in the cease area is effective in improving the uniformity of plasma density distribution. The gas supply device 6 meeting the foregoing conditions is capable of distributing the process gas in a wide range over the wafer W without obstructing the propagation of microwaves (longitudinal waves) in the vacuum vessel 1. Consequently, the surface of the wafer W can be highly uniformly plasma-processed.

It is preferable for the aforesaid reason that a lower part of the gas supply device 6 lie in the plasma luminescent area. Conductive elements dividing the cease area may have the functions of the gas supply device. For example, conductive metallic tapes may be attached to the lower surface of the microwave transmitting window 3 to divide the microwave propagation region as mentioned above. Some of a structure including the electromagnetic wave absorber 4 shown in FIG. 1, a structure including the conductive elements 51 and 52 and the conductive elements 53 and 54 embedded in the microwave transmitting window 3, and a structure including the conductive members disposed in the cease area may be used in combination.

Figure 15:
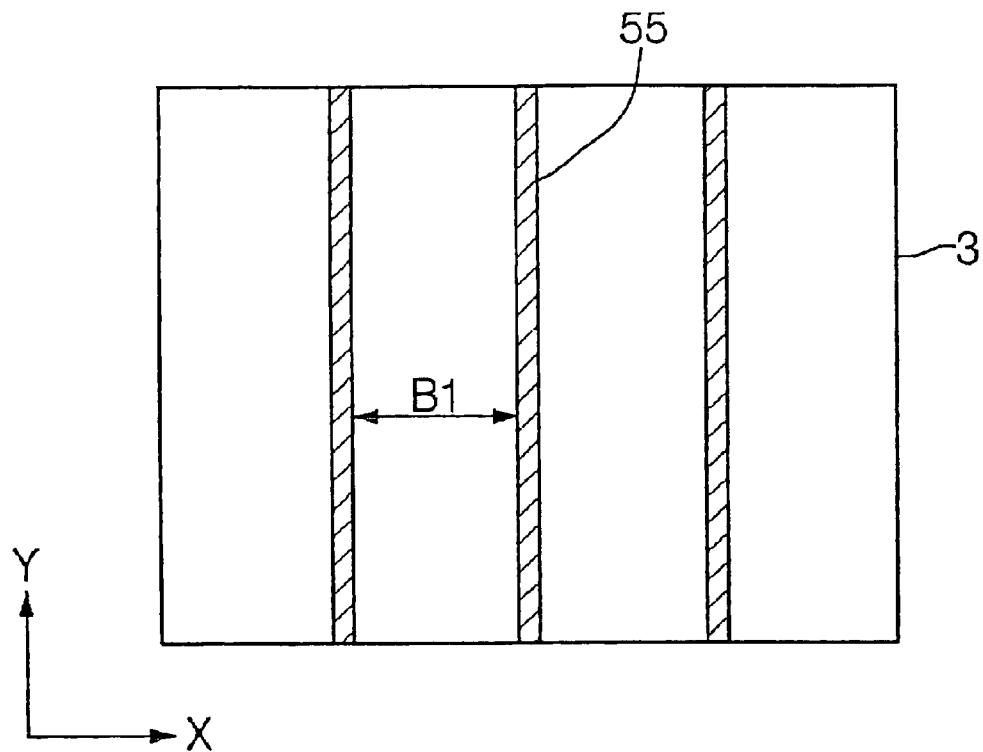
FIG. 15 is a cross-sectional view of a modification of the arrangement of the conductive structure shown in FIGS. 9 and 10.
Figure 16:
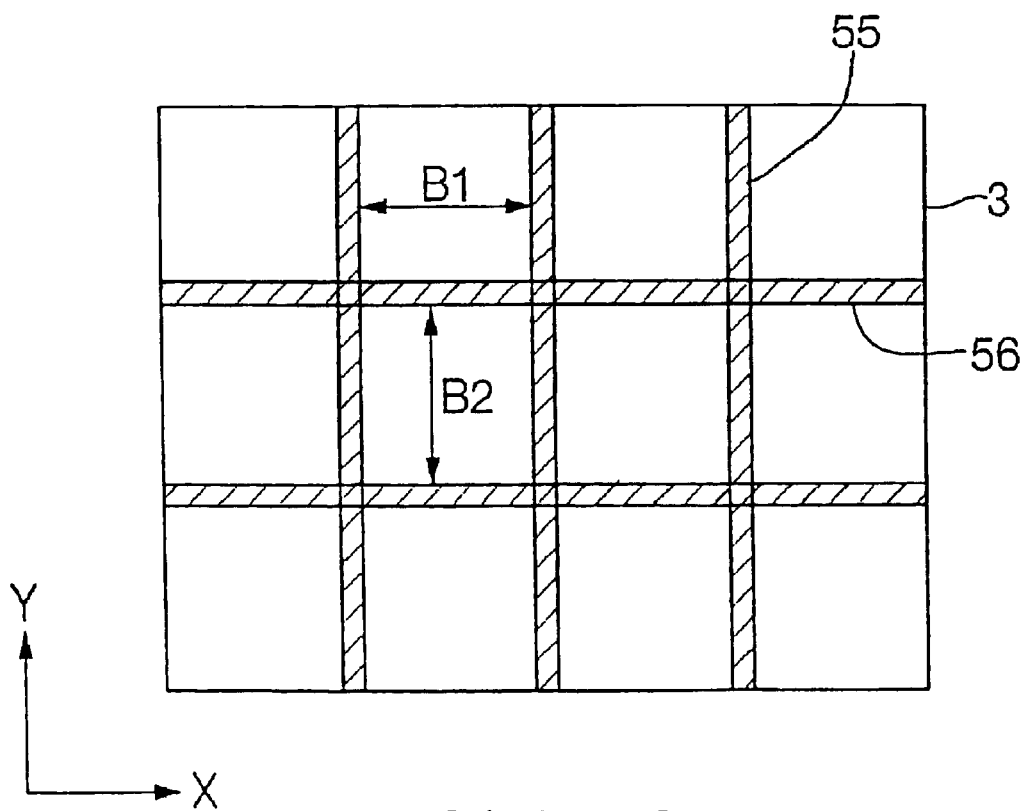
FIG. 16 is a cross-sectional view of a modification of the arrangement of the conductive structure shown in FIG. 15.

The plasma processing systems in the foregoing embodiments are applicable not only to plasma-processing a wafer W but also to plasma-processing a glass substrate for a liquid crystal display. In the plasma processing system for processing a glass substrate for a liquid crystal display, the microwave transmitting window 3 may be divided into divisions arranged along the X-axis as shown in FIG. 15 by a plurality of conductive members 55 extended in parallel the Y-axis or may be divided into divisions arranged in rows and columns as shown in FIG. 16 by a plurality of conductive members 55 extended in parallel to the Y-axis and a plurality of conductive members 56 extended in parallel to the X-axis. Preferably, the interval B1 (B2) between the adjacent conductive members 55 (56) meets an inequality: $\lambda/2 \leq$ B1 (B2) $<\lambda$.

The power supply system that supplies power for ionizing a process gas to produce a plasma does not need necessarily to be a microwave power supply system; the same may be an RF power supply system or an UHF power supply system. In this specification, microwave power supply systems, RF power supply systems and UHF power supply systems are designated inclusively as radio-frequency power supply systems. A plasma may be produced, for example, by a plasma producing method that ionizes a process gas by electron cyclotron resonance using microwaves and a magnetic field. The foregoing plasma processing systems are applicable not only to a film forming process but also to etching processes and ashing processes.

Figure 17:
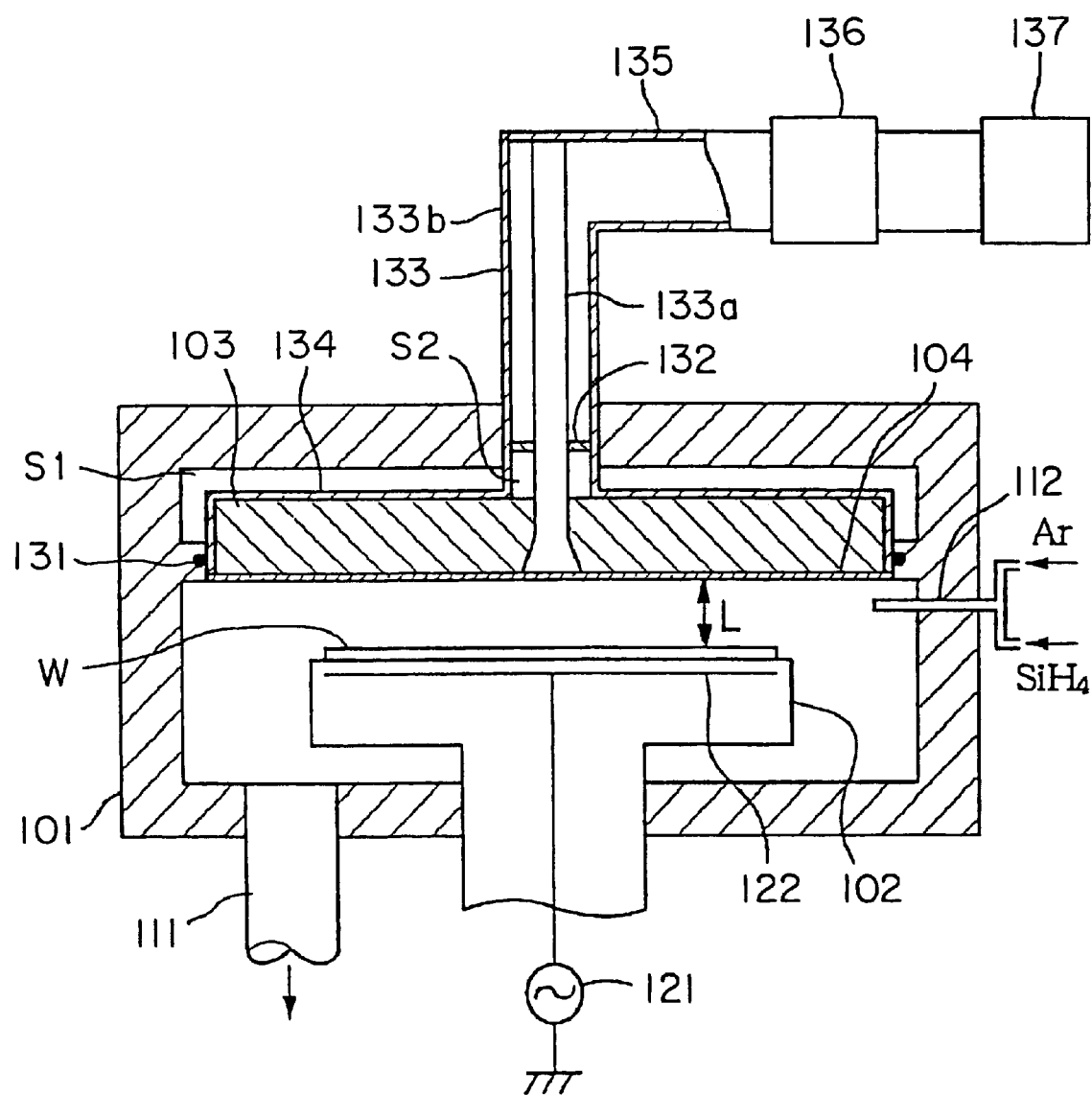
FIG. 17 is a longitudinal sectional view of a plasma processing system in a third embodiment according to the present invention.

FIG. 17 shows another embodiment of the present invention. In this embodiment, a plasma processing system has a cylindrical vacuum vessel 101 of, for example, aluminum. A table 102 for a wafer W, i.e., a substrate is arranged in the vacuum vessel 101. A discharge pipe 111 for evacuation is connected to the bottom wall of the vacuum vessel 101, and a gas supply unit 112 is attached to the side wall of the vacuum vessel 101. An electrode 122 for applying a bias voltage to the table 102 is embedded in the table 102 and is connected to a high-frequency power supply system 121 that supplies power of, for example, 13.56 MHz. A temperature regulator, not shown, is combined with the table 102 to regulate the temperature of the wafer W at a predetermined temperature.

A dielectric member 103 of, for example, quartz having a thickness in the range of about 3 to about 5 cm is put on an upper end part of the vacuum vessel 101. The gap between the dielectric member 103 and the vacuum vessel 101 is sealed in an airtight fashion with a sealing member 131 so that a vacuum space can be created under the dielectric member 103. An end part of a tube 133a included in a coaxial waveguide 133 penetrates a central part of the dielectric member 103. An outer tube 133b included in the coaxial waveguide 133 has an expanded part 134 of a shape resembling a flat cylinder formed by radially expanding a lower end part of the outer tube 133b in a flange and perpendicularly bending a peripheral part of the flange. The dielectric member 103 is covered with the expanded part 134. One end of a rectangular waveguide 135 is connected to the side of the other end of the coaxial waveguide 133. The other end of the rectangular waveguide 135 is connected through an impedance matching device 136 to a microwave power supply system 137.

Figure 18:
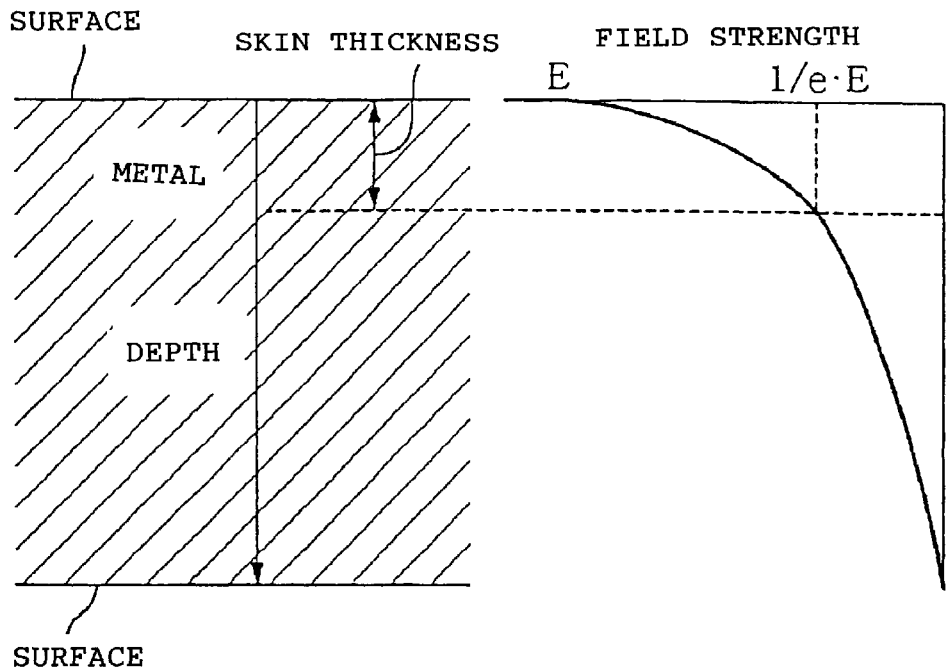
FIG. 18 is a diagram of assistance in explaining the functions of a conductive film shown in FIG. 17.

The lower surface, i.e., the surface facing the table 102, of the dielectric plate 103 is coated with a conductive film 104 of a metal, such as aluminum. The conductive film 104 will be described. Generally, a conductive body of, for example, a metal absorbs an electric field as shown in FIG. 18. Suppose that microwaves fall on the upper surface of the conductive body. Then, field strength decreases at an exponential rate from the upper surface toward the lower surface. A thickness (depth) of a surface layer from the surface (upper surface) of a metal body that reduces a field strength E at the surface to 1/e (e is the base of natural logarithm) of the field strength E is called skin thickness (skin depth). An electric field penetrates a metal body when the thickness of the metal body is smaller than the skin thickness. The electric field penetrated the metal body is called an evanescent electric field that does not propagate. The conductive film 104 is formed in a thickness smaller than or approximately equal to the skin thickness to permit an electric field to extend through the conductive film 104 toward the wafer W. When the conductive film 104 is formed of, for example, aluminum, the skin thickness is in the range of 3 to 5 μm depending on a method by which the conductive film 104 is formed. Therefore, the thickness D of the conductive film 104 is in the range of about 1 to about 2 μm. In FIG. 17, the thickness of the conductive film 104 is exaggerated.

Figure 19:
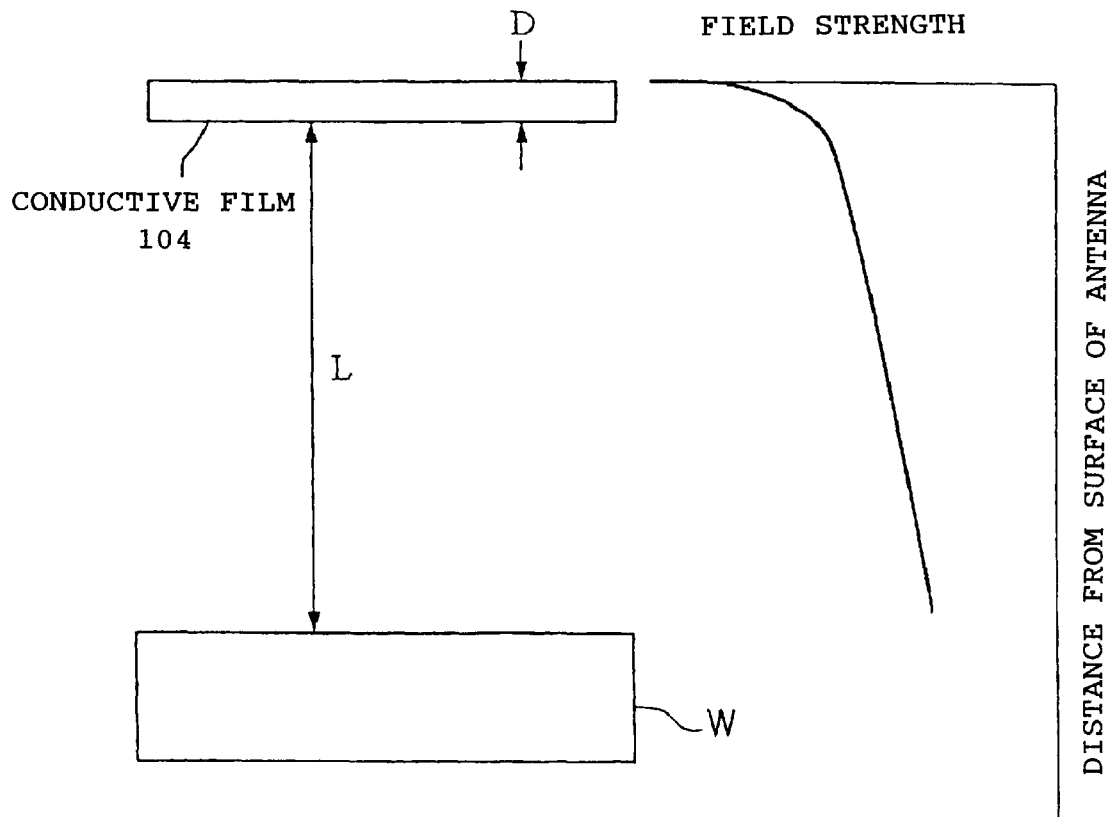
FIG. 19 is diagram of assistance in explaining the attenuation characteristic of field strength of an electric field created between a wafer placed on a table and a conductive film shown in FIG. 17.

The strength of the evanescent electric field penetrated the conductive film 104 decreases downward as shown in FIG. 19. Since a plasma is produced in a space immediately below the conductive film 104, the strength of the evanescent electric field in such a space is sufficient for producing a plasma. Only a narrow diffusing region is available and it is difficult to supply a gas if the distance L between the wafer W and the conductive film 104 is excessively short. A plasma diffuses toward a wall surrounding a plasma luminescent area and fades away if the distance L is excessively big and hence the microwave power supply system 137 must supply large power. Therefore, a preferable value of the distance L is in the range of about 5 to about 10 cm.

The expanded part 134 of the waveguide 133 lies in the vacuum vessel 101. A space S1 formed by the expanded part 134 and the walls of the vacuum vessel 101 is isolated by a sealing member 131 from the plasma generating space. It is possible that the dielectric member 103 is deformed by the difference between the pressure in the space S1 and that in the vacuum vessel 101 if the space S1 is kept at the atmospheric pressure. Therefore, the space S1 may be evacuated through a discharge passage, not shown, to stabilize the shape of the dielectric member 103. Since it is possible that a lower part of the waveguide 133 extending in the vacuum vessel 101 is deformed by the difference between the pressure in the waveguide 133 and that in the vacuum vessel 101 if the space in the waveguide 133 is kept at the atmospheric pressure, a sealing member 132 may be placed in the lower part of the waveguide 133 extending in the top wall of the vacuum vessel 101 to seal a space S2 under the sealing member 132, and the space S2 may be evacuated through a discharge passage, not shown.

Figure 20:
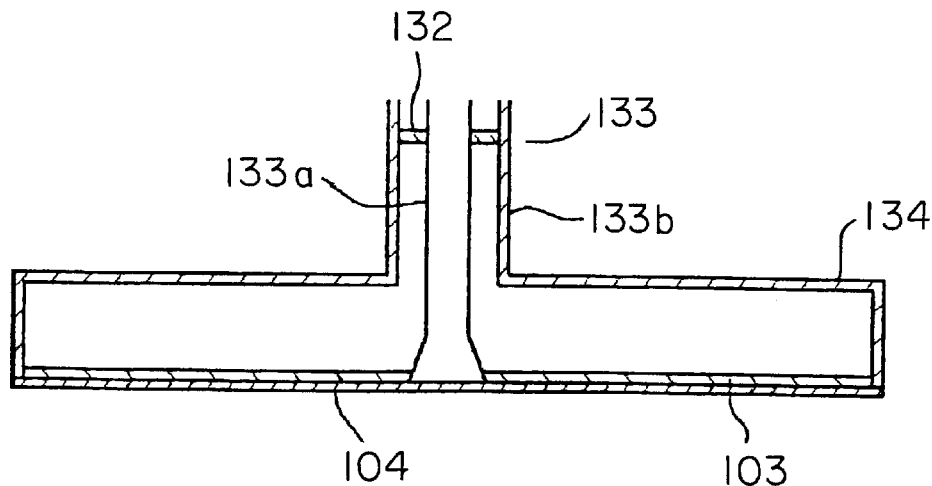
FIG. 20 is a schematic sectional view of a modification of the third embodiment shown in FIG. 17.

The dielectric member 103 does not need necessarily fit the expanded part 134 closely. The dielectric member 103 may be a thin glass plate and a space may be formed between the dielectric member 103 and the expanded part 134 as shown in FIG. 20. The shape of the dielectric member 103 can be stabilized when the space in the expanded part 134 is sealed and evacuated.

The operation of the plasma processing system in this embodiment will be described on an assumption that the plasma processing system is used for forming a polysilicon film on a wafer, i.e., a substrate. A gate valve, not shown, is opened and a wafer W is mounted on the table 102 by a carrying arm, not shown. The gate valve is closed and the vacuum vessel 101 is evacuated to a predetermined vacuum, and then a film forming gas, such as $SiH_4$ gas, and a carrier gas, such as Ar gas, are supplied into the vacuum vessel 101 by the gas supply unit 112. Subsequently, the microwave power supply system 137 supplies microwave power of, for example, 2.45 GHz, 2.5 kw and the bias power supply system 121 supplies bias power of, for example, 13.56 MHz, 1.5 kW to the table 102.

Microwaves emitted by the microwave power supply system 137 propagate through the waveguides 135 and 133 to the expanded part 134, penetrate the dielectric member 103 and fall on the conductive film 104. Since the thickness of the conductive film 104 is smaller than or approximately equal to the skin thickness as mentioned above, an electric field penetrates the conductive film 104 and extends into the vacuum vessel 101 in an evanescent electric field. The evanescent electric field ionizes the process gas to produce a plasma. Active species produced by ionizing $SiH_4$ gas deposit on the surface of the wafer W to form a polysilicon film.

The microwaves propagated through the waveguide 133 reach the conductive film 104 serving as an antenna and the evanescent electric field does not propagate. Therefore, the formation of a standing wave is suppressed, the influence of a standing wave on field strength distribution is insignificant. Consequently, a plasma of a uniform plasma density is produced, and the surface of the wafer W is plasma-processed uniformly to form a uniform film on the wafer W.

Figure 21:
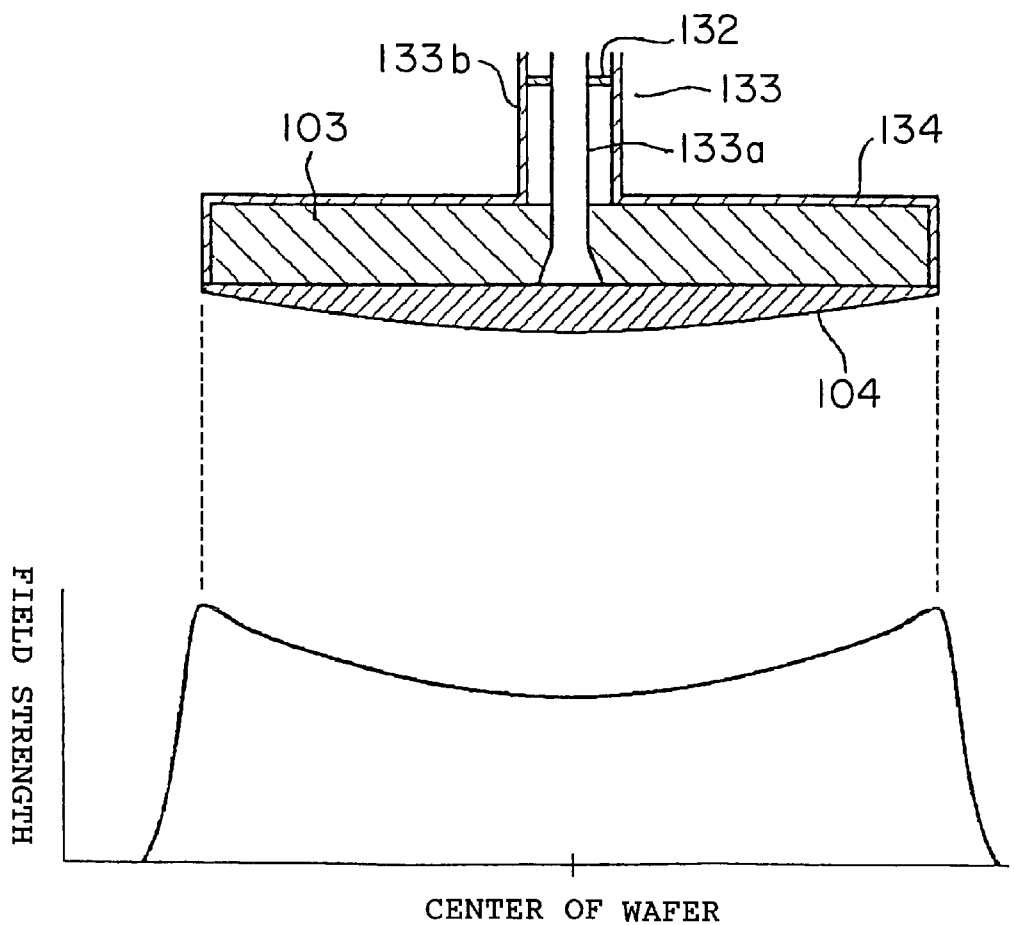
FIG. 21 is a schematic sectional view of another modification of the third embodiment shown in FIG. 17.
Figure 22:
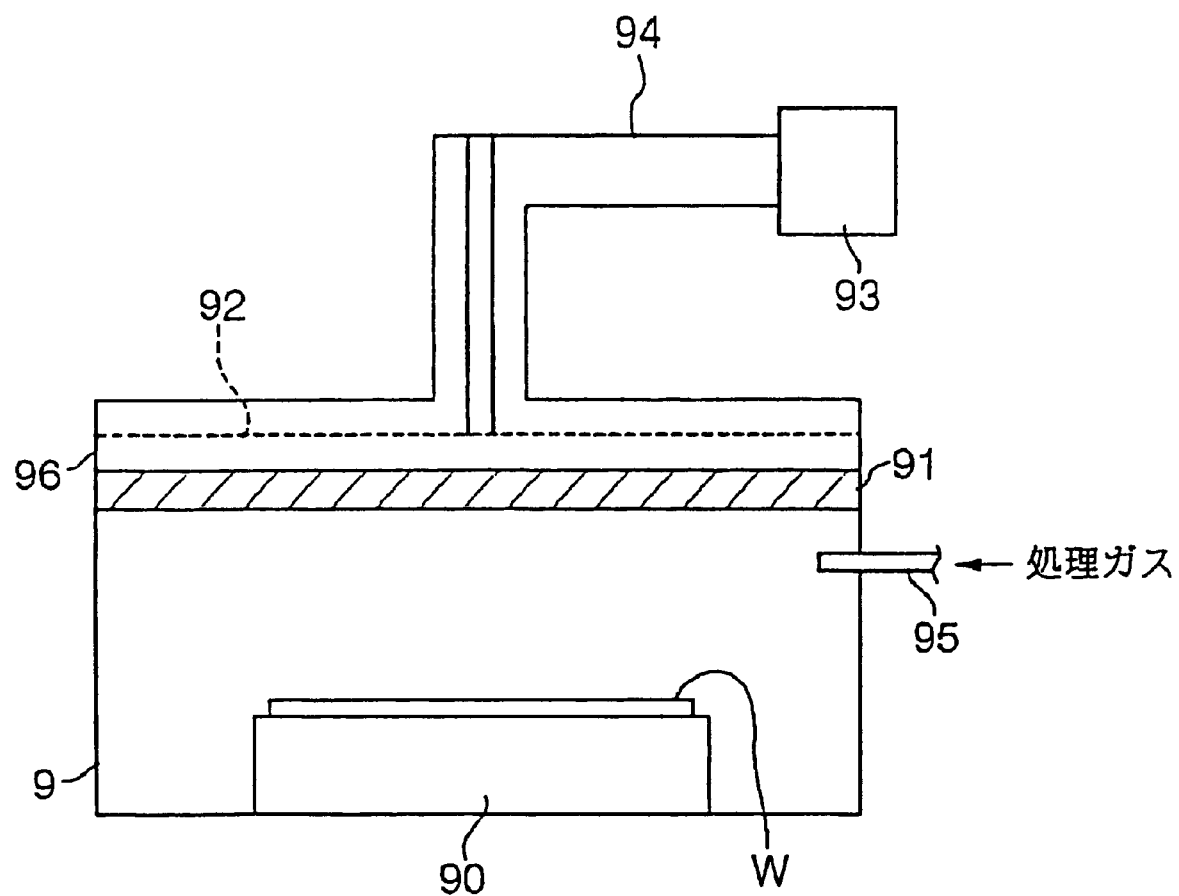
FIG. 22 is a schematic view of a conventional plasma processing system.

Although the conductive film 104 may be formed in a uniform thickness, the conductive film 104 may be formed such that the thickness thereof decreases from a central part thereof toward the circumference thereof as shown in FIG. 21. When the conductive film 104 shown in FIG. 21 is used, the field strength of the electric field that penetrates a peripheral part of the conductive film 104 is higher than that of the electric field that penetrates a central part of the conductive film 104 and hence a high-density plasma is produced around the peripheral part of the conductive film 104. The plasma diffuses, the density of the plasma decreases gradually with distance from a region where the plasma is produced and the plasma is annihilated at the inner surface of the vacuum vessel. Therefore, when a plasma having a high density in a region around peripheral part of the lower surface of the conductive film 104 is produced, the plasma diffuses inward and is annihilated at the inner surface of the vacuum vessel and, consequently, the uniformity of the plasma is enhanced.

The conductive film 104 may be formed on the upper surface of the dielectric member 103 or may be embedded in the dielectric member 103. The power supply system that supplies power for ionizing a process gas to produce a plasma does not need necessarily to be a microwave power supply system; the same may be an RF power supply system or an UHF power supply system. In this specification, microwave power supply systems, RF power supply systems and UHF power supply systems are designated inclusively as radio-frequency power supply systems. The present invention is applicable not only to a film forming process but also to etching processes and ashing processes.

As mentioned above, the plasma produced by using an electric field penetrated the conductive film of a thickness smaller or approximately equal to the skin thickness has a highly uniform density over the surface of a substrate, so that the substrate can be highly uniformly plasma-processed.

What is claimed is:

1. A plasma processing system comprising:
   a vacuum vessel;
   a substrate table arranged in the vacuum vessel for supporting a substrate;
   a microwave power supply system for generating high-frequency waves;
   a waveguide for guiding said high-frequency waves into the vacuum vessel;
   a dielectric member arranged at an end portion of the waveguide; and a conductive film of a metal coated on the lower surface of said dielectric member, the conductive film facing the substrate table, the conductive film having a thickness smaller than a skin thickness of the conductive film so that standing wave formation in the vacuum vessel is suppressed while allowing high-frequency waves to penetrate the conductive film toward the substrate.

2. The plasma processing system of claim 1, wherein the waveguide comprises an inner tube and an outer tube arranged coaxially with the inner tube, wherein the inner tube penetrates the dielectric member.

3. The plasma processing system of claim 1, wherein the waveguide comprises an inner tube and an outer tube arranged coaxially with the inner tube, and the outer tube comprises an expanded end part in which the dielectric member is arranged.

4. The plasma processing system of claim 3, wherein an interior of the expanded end part is entirely filled with the dielectric member.

5. The plasma processing system of claim 1, wherein the thickness of the conductive film decreases from a central portion thereof toward a peripheral portion thereof.

* * * * *